Sept. 1, 1970 D. J. SIKORRA 3,526,845

APPARATUS FOR OVERCURRENT PROTECTION OF A PUSH-PULL AMPLIFIER

Filed Dec. 19, 1966

INVENTOR.
DANIEL J. SIKORRA
BY Bruce C Lutz
ATTORNEY

United States Patent Office 3,526,845

Patented Sept. 1, 1970

3,526,845

APPARATUS FOR OVERCURRENT PROTECTION OF A PUSH-PULL AMPLIFIER

Daniel J. Sikorra, Champlin, Minn., assignor, by mesne assignments, to the United States of America as represented by the Administrator of the National Aeronautics and Space Administration Filed Dec. 19, 1966, Ser. No. 602,828
Int. Cl. H03f *3/18, 3/30, 3/50*
U.S. Cl. 330—11 3 Claims

ABSTRACT OF THE DISCLOSURE

This disclosure relates to electronic circuitry which may be used to provide overcurrent protection to a push-pull amplifier. A pair of complementary amplifying transistors arranged in push-pull amplifier configuration are provided with voltage biasing circuits coupled to the input of each transistor and degeneration resistance means connected between each transistor and a common node output terminal. Voltage breakdown means are coupled between the common node and each input terminal of the amplifying transistors in a direction such that excess current in the degeneration resistance means associated with either amplifying transistor causes the voltage breakdown means associated with the other amplifying transistor to conduct and apply a voltage to turn off said other transistor whereby short circuit protection is provided the amplifier by the voltage breakdown means in conjunction with the biasing means.

The invention described herein was made in the performance of work under a NASA contract and is subject to the provisions of Section 305 of the National Aeronautics and Space Act of 1958, Public Law 85–568 (72 Stat. 435; 42 U.S.C. 2457).

BACKGROUND AND SUMMARY

In many push-pull amplifiers if the load is shorted inadvertently, the amplifier will be destroyed. The present invention was developed in response to this problem. The circuitry of the present invention prevents a current greater than a predetermined amount from flowing in the amplifier.

Another problem in push-pull amplifiers is that they may oscillate or be driven at a high frequency. If complementary symmetry transistors are used, the oscillation and inherent storage effects in amplifiers may cause both sides of the push-pull amplifier to conduct at the same time for a brief period. This causes a short circuit between the two bias supplies providing bias to the push-pull amplifier and destroys the amplifier. The present invention eliminates this problem also by providing that overcurrent in one part or side of a push-pull amplifier turns off the other part or side.

DESCRIPTION

It is an object of this invention to advance the amplifier art by providing short circuit protection to a push-pull amplifier.

Figure 1:
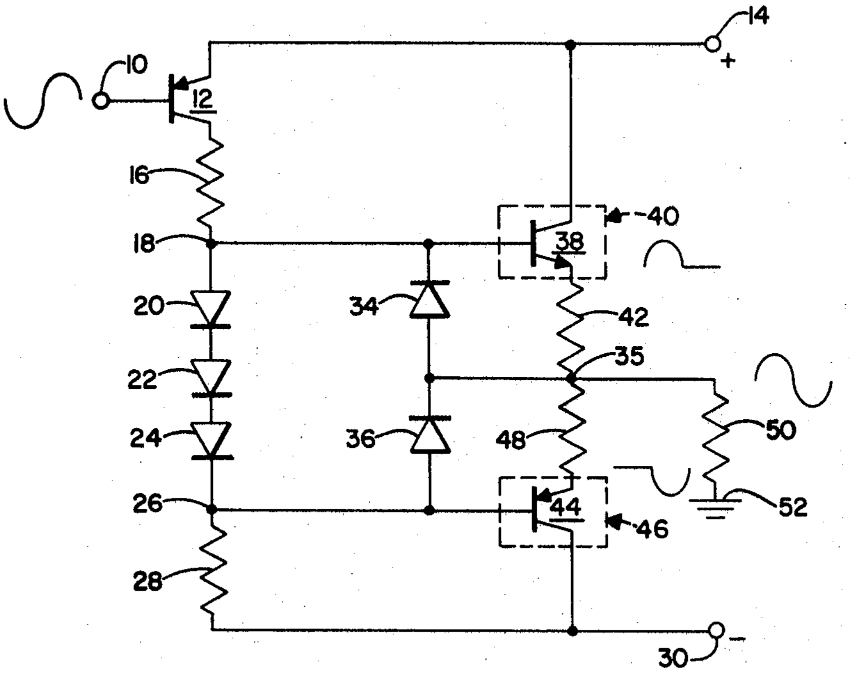
Figure 2:
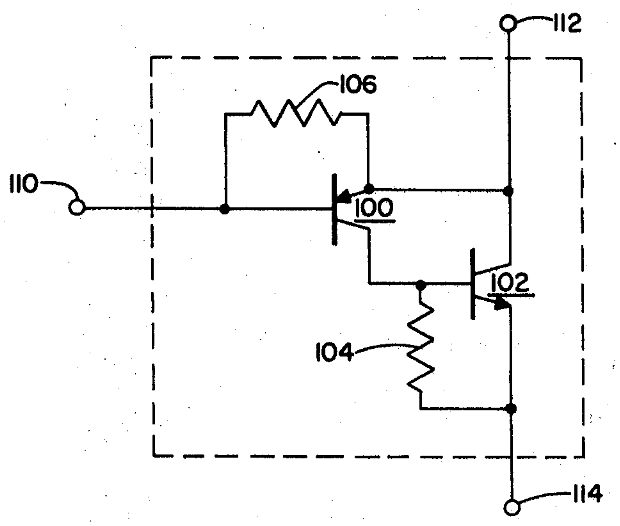

Further objects and advantages will become apparent from the reading of this specification and claims in conjunction with the drawings wherein:

FIG. 1 shows a preferred embodiment of a push-pull amplifier using the teachings of the present invention; and FIG. 2 shows a substitute circuit to be combined with a portion of FIG. 1 to provide another embodiment of the invention.

In FIG. 1, an apparatus input means 10 is connected to a base of a PNP transistor 12 having an emitter, a base and a collector. The emitter of transistor 12 is connected to a terminal 14 which is adapted to be connected to a source of direct voltage of a first polarity. A resistor 16 is connected between a junction point 18 and the collector of transistor 12. Junction point 18 also functions as an input means to one-half, a side, or a part of the push-pull amplifier. A series of diodes 20, 22, and 24 are connected between junction point 18 and a junction point 26, so that the easy direction of a current flows from junction point 18 to junction point 26. Junction point 26 functions as an input means to the other half, side, or part or the push-pull amplifier. A resistor 28 is connected between junction point 26 and a terminal 30. Terminal 30 is adapted to be connected to a second source of direct voltage of a second polarity. Another diode, non-linear impedance means, or non-linear voltage breakdown means 34 has its cathode connected to junction point 18 and its anode connected to a junction point 35. Still another diode, non-linear impedance means, or non-linear voltage breakdown means 36 has its anode connected to junction point 26 and its cathode connected to junction point 35. An NPN transistor or three terminal amplifying transistor 38 having a base, emitter, and collector forms a portion 40 of the push-pull amplifier in the embodiment shown. Transistor 38 has its collector connected to terminal 14, its base connected to junction point 18 and its emitter connected to junction point 35 through an impedance means or degeneration resistor 42. A PNP transistor or three terminal amplifying transistor 44 having a base, emitter, and collector forms another portion 46 of the push-pull amplifier. Transistor 44 has its collector connected to terminal 30, its base connected to junction point 26, and its emitter connected to junction poin 35 through an impedance means, or degeneration resistor 48. A load means or resistor 50 is connected between junction point 35 and a common potential or ground 52.

In FIG. 2, a PNP transistor 100 having a base, emitter, and a collector and an NPN transistor 102 having a base, emitter, and collector are interconnected such that collector of transistor 102 is connected to the emitter of transistor 100 and the base of transistor 102 is connected to the collector of transistor 100. A resistor 104 is connected between the emitter of transistor 102 and the collector of transistor 100. A resistor 106 is connected between the emitter of transistor 100 and the base of transistor 100. The base of transistor 100 is also connected to a terminal 110. The collector of transistor 102 is connected to a terminal 112. The emitter of transistor 102 is connected to a terminal 114.

OPERATION

Assume for the moment that diodes 34 and 36 are not present. A signal at input means 10 is amplified by transistor 12 and appears at junction points 18 and 26. If transistors 38 and 44 are biased class B or class AB, then the positive portion of the signal at junction point 18 will be amplified by transistor 38 because it is an NPN transistor and the negative portion of the signal at junction point 26 will be amplified by transistor 44 because it is a PNP transistor. The negative portion of the signal at junction point 18 will turn transistor 38 off, and the positive portion of the signal at junction point 26 will turn transistor 44 OFF. All of this is well known to those skilled in the art. This means that load means 50 is driven by transistor 38 during one-half of the cycle and by transistor 44 during the other half of the cycle.

This is what is meant by a push-pull amplifier, as again is well known to those skilled in the art.

The diodes 20, 22, and 24 are inserted to provide bias separation to transistors 38 and 44. That is, two of the diodes compensate for the emitter base diode effect of transistors 38 and 44 and the remaining diode biases the transistors slightly ON so as to become, in this case, biased in class AB. It will be realized by those skilled in the art that fewer or more diodes can be used depending on the type or class of bias desired.

Thus far the conventional class AB emitter follower type amplifier has been explained. Now the circuit with diodes 34 and 36 inserted will be considered.

Assume that an excessive current is drawn by transistor 38. Considering the series circuit formed by resistor 42, diode 36, diode 24, diode 22, diode 20, and emitter base junction of transistor 38, it is seen that all of the voltage drops in this series circuit are fixed by non-linear characteristics except the voltage drop in resistor 42. It is also seen that the voltage across the emitter base junction of transistor 38 and the voltage across diode 36 approximately balance each other in the series circuit and therefore these two terms may be stricken from consideration. What remains is equal and opposite voltage drops across the diodes 20, 22, and 24 and the resistor 42. Thus it is easily seen that the instantaneous voltage across resistor 42 can be no greater than the voltage across diodes 20, 22, and 24 or there will be less instantaneous bias on transistor 38 than required, and it will begin to turn off. This means that if an excess current through resistor 42 causes the voltage across resistor 42 to equal the sum of the diode voltages, the circuit will begin current limiting. The level of current limiting is determined by resistor 42 since the size of the resistor determines what voltage is developed from the current flowing through it.

Another feature of this invention is that if transistor 38 tends to draw an excessive current, diode 36 turns ON. It is seen that diode 36 impresses a voltage across the emitter base junction of transistor 44 which is opposite from that which transistor 44 needs to remain in a conducting state. This means that whenever one transistor attempts to draw an excessive current, the other transistor is turned off. This feature prevents any high frequency oscillation or driving voltage from causing both transistors to remain conducting at the same time which would cause a short circuit from the voltage impressed at terminal 14 through transistors 38 and 44 to the voltage impressed at terminal 30.

It is obvious to those skilled in the art that the symmetry of the circuit requires that the converse explanation hold for the remainder of the circuit, if an excess of current is drawn by transistor 44.

The circuitry of FIG. 2 may be substituted directly for the three terminal element 46 contained within the dashed lines. This is because the circuitry within FIG. 2 performs as a high gain PNP transistor. This circuit is familiar to those skilled in the art. The advantage of this circuit is that an NPN transistor may be used for the power stage and a relatively low power PNP transistor used as a driver. In the current state of the art it is easier and cheaper to obtain the high power NPN transistor than to obtain a high power PNP transistor of equal specifications.

Other configurations will be obvious to one skilled in the art. In fact, it is realized that many three terminal amplifier configurations may replace amplifiers 40 and 46. Amplifiers 40 and 46 have been represented as a single transistor for the sake of simplicity only.

It is also obvious to those skilled in the art that diodes 20, 22, and 24 are not necessarily the only biasing arrangement possible. Resistors, batteries, or Zener diodes could be used. However, diodes are preferred at this time.

I claim:

1. Apparatus providing short circuit protection for a push-pull amplifier comprising:

(a) a plurality of complementary symmetry amplifying transistor means arranded in push-pull amplifier configuration, each amplifying transistor means having three terminals, including a base terminal;

(b) a plurality of degeneration resistance means, one of said degeneration resistance means being connected to a first terminal of a first of said amplifying transistor means and another of said degeneration resistance means being connected to a first terminal of the second of said amplifying transistor means, said degeneration resistance means being connected together at a common node output terminal of said push-pull amplifier;

(c) circuit biasing means coupled to the input of each amplifying transistor means by connection between the base terminal of said first amplifying transistor means and the base terminal of said second amplifying transistor means wherein the base terminal of each transistor means is an input terminal, in each amplifying transistor means said third terminal being operatively connected whereby said amplifying transistor means provide push-pull amplification; and (d) a pair of non-linear impedance voltage-breakdown means, one of said non-linear impedance means connected between the base terminal of said first amplifying transistor and the common node output terminal and the other of said non-linear impedance means connected between the base terminal of the second amplifying transistor and said common node output terminal, said non-linear impedance means being connected in a direction such that an excess of current in one amplifying transistor and its associated degeneration resistance means coupled thereto causes the other non-linear impedance means associated with the other of said amplifying transistors to conduct current and apply a voltage to turn off said other amplifying transistor whereby short circuit protection is provided the push-pull amplifier by the non-linear impedance means in conjunction with the biasing means.

2. The apparatus of claim 1 wherein the non-linear impedance meanns comprises diode means.

3. The apparatus of claim 1 wherein the biasing means includes diode means.

References Cited

UNITED STATES PATENTS

| | | | |
|---|---|---|---|
| 3,015,781 | 1/1962 | Eklov | 330—15 |
| 3,375,455 | 3/1968 | Motta | 330—24 X |

NATHAN KAUFMAN, Primary Examiner

U.S. Cl. X.R.

330—24, 13, 14, 15, 26